US005079671A

United States Patent [19]

Garrett et al.

[11] Patent Number: 5,079,671

[45] Date of Patent: Jan. 7, 1992

[54] ELECTRICAL HEADER CONNECTOR FASTENING BRACKET

[75] Inventors: Roger L. Garrett, New Wilmington, Pa.; John M. Sova, Cortland, Ohio

[73] Assignee: General Motors Corporation, Detroit, Mich.

[21] Appl. No.: 664,150

[22] Filed: Mar. 4, 1991

[51] Int. Cl.[5] .......................... H05K 7/06; H01R 9/00

[52] U.S. Cl. ....................................... 361/331; 439/79

[58] Field of Search .................... 361/331; 439/33, 79, 439/660

[56] References Cited

U.S. PATENT DOCUMENTS 4,491,376 1/1985 Gladd et al. .................... 439/660 X 4,722,691 2/1988 Gladd et al. .......................... 439/79

FOREIGN PATENT DOCUMENTS 3637190 5/1988 Fed. Rep. of Germany ........ 439/84

*Primary Examiner*—Donald A. Griffin

*Attorney, Agent, or Firm*—Francis J. Fodale

[57] ABSTRACT

An electrical header connector is attached to a printed circuit board by a sheet metal bracket or brackets comprising a body portion that has retaining means at each lateral end in the form of runners that are inserted into narrow longitudinal slots of the electrical header connector and have lock tangs that dig into surfaces of the slots to securely fasten the sheet metal bracket to the electrical header connector. The body portion further including at least one spring clip disposed between the runners that is pushed into a hole of the printed circuit board to attach the electrical header connector to the printed circuit board. The sheet metal bracket may also include means for establishing an electrical ground connection between a ground wire and the printed circuit board.

13 Claims, 4 Drawing Sheets

ELECTRICAL HEADER CONNECTOR FASTENING BRACKET

BACKGROUND OF THE INVENTION

This invention relates generally to electrical header connectors and more specifically to a bracket for fastening an electrical header connector to a printed circuit board.

Wiring harnesses are typically connected to electronic control circuits on printed circuit boards by means of an electrical plug connector and an electrical header connector that are attached to the wiring harness and printed circuit board respectively.

A typical electrical header connector for such an arrangement is disclosed in U.S. Pat. No. 4,491,376 granted to Joseph H. Gladd, Robert G. Plyler and Lyle B. Suverison Jan. 1, 1985. This electrical header connector is attached to the printed circuit board by means of rivets as shown in FIG. 3 of the patent.

It is also known to provide such electrical header connectors with a sheet metal grounding bracket that is press fitted into narrow longitudinal slots in mounting portions of the plastic header connector housing. This sheet metal grounding bracket is then used to secure the electrical header connector to the printed circuit board by self tapping screws that pass through holes of the printed circuit board and screw into undersize holes of the sheet metal grounding bracket.

SUMMARY OF THE INVENTION

The object of this invention is to provide a sheet metal bracket that secures the electrical header connector to the printed circuit board without the need for any auxiliary parts, such as self tapping screws, or any complicated secondary assembly operations.

A feature of the invention is that the sheet metal bracket has an integral clip or clips that are pushed into holes of the printed circuit board to secure the electrical header connector to the printed circuit board.

Another feature of the invention is that the integral clips have retention barbs that are robust and easily formed with simplified tooling.

Another feature of the invention is that the sheet metal bracket has improved means for retaining the sheet metal bracket in slots of a plastic connector housing.

Still yet another feature of the invention is that the sheet metal bracket may incorporate improved means for connecting a ground wire to the sheet metal bracket when such a capability is desired.

Other objects and features of the invention will become apparent to those skilled in the art as disclosure is made in the following detailed description of a preferred embodiment of the invention which sets forth the best mode of the invention contemplated by the inventors and which is illustrated in the accompanying sheet(s) of drawing.

DETAILED DESCRIPTION OF THE PREFERRED EMBODIMENT

Figure 1:
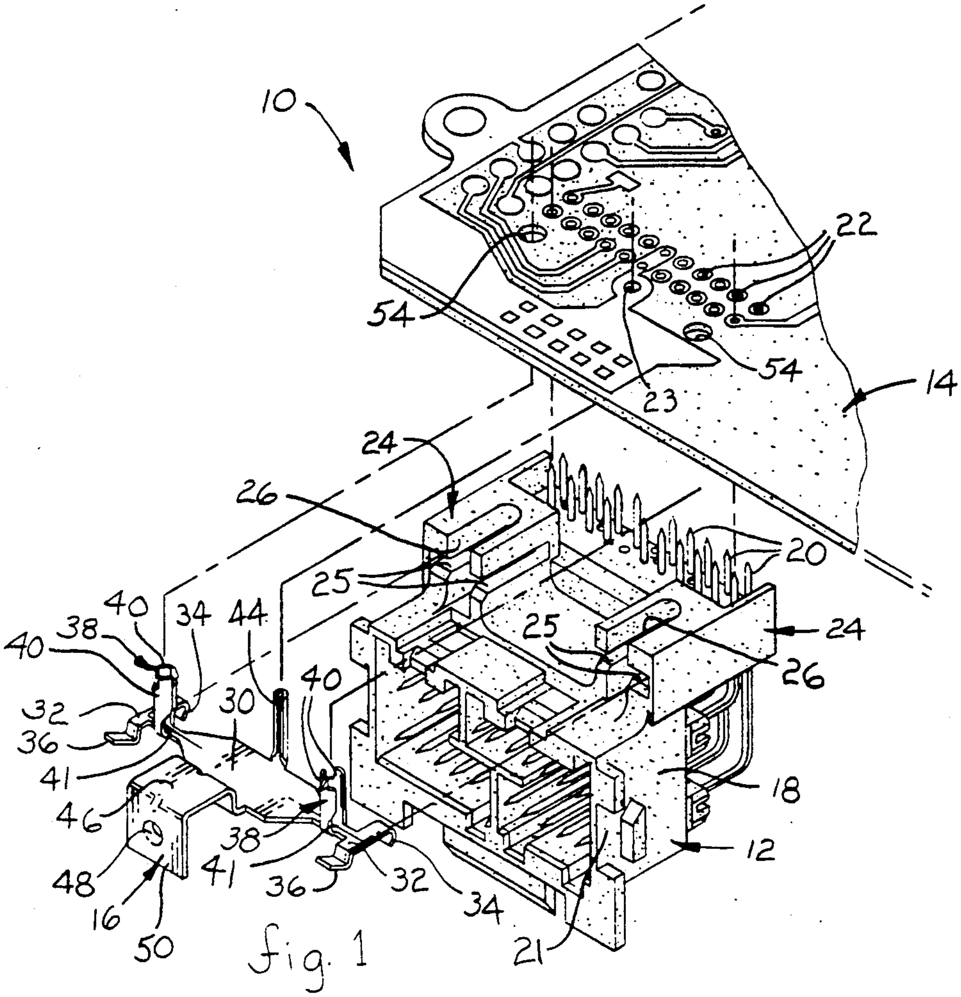
FIG. 1 is an exploded perspective view of a printed circuit board assembly in which an electrical header connector is secured to a printed circuit board by a sheet metal bracket in accordance with this invention.

Referring now to the drawing, FIG. 1 is an exploded perspective view of a printed circuit board assembly 10 in which an electrical header connector 12 is secured to a printed circuit board 14 by a sheet metal bracket 16 in accordance with this invention.

Figure 2:
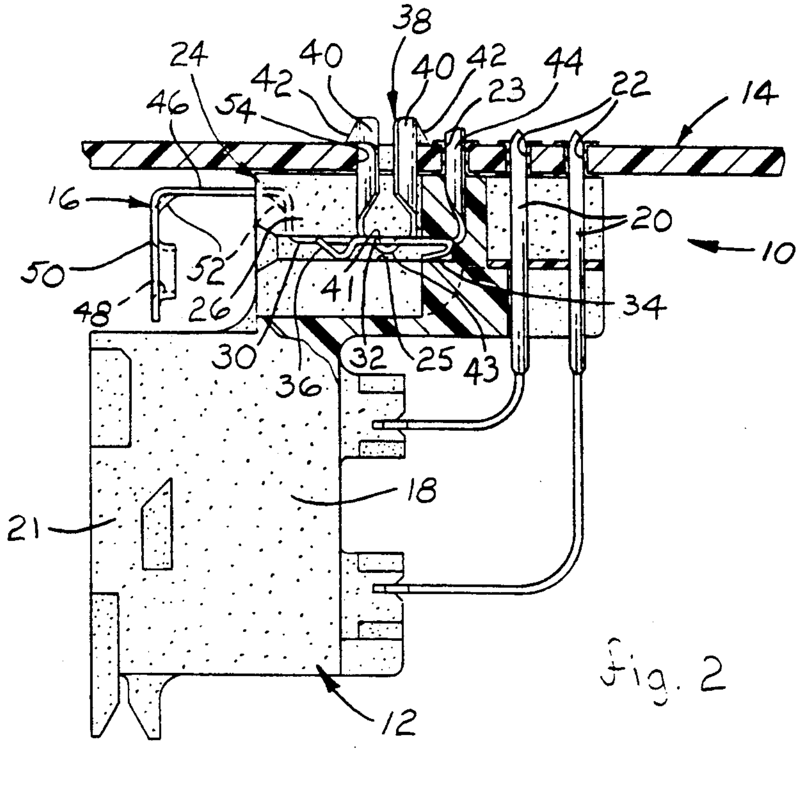
FIG. 2 is a side view of the printed circuit board assembly of FIG. 1 with the electrical header connector partially sectioned to illustrate details of the sheet metal bracket.

The electrical header connector 12 comprises a plastic connector housing 18 that contains a plurality of L-shaped pin terminals 20. The horizontal ends of the pin terminals 20 project into a socket portion 21 of the plastic connector housing 18 that receives an electrical plug connector of a wiring harness (not shown). The vertical ends of the pin terminals 20 project above the top of the plastic connector housing 18 and extend through plated contact holes 22 of the printed circuit board 14 when the electrical header connector 12 is secured to the printed circuit board 14 as shown in FIG. 2. The vertical ends of the pin terminals are wave soldered to the printed circuit board 14 to establish a good electrical contact with the plated contact holes 22 in accordance with conventional manufacturing techniques.

The top of the plastic connector housing 18 has two identical laterally spaced mounting portions 24 that are adapted to receive the respective lateral end portions of the sheet metal bracket 16. Consequently, each mounting portion 24 has a narrow longitudinal slot 25 that is intersected by a vertical slot 26 that extends through the top of the plastic connector housing 18. The longitudinal slot 25 of each mounting portion 24 is blind ended to serve as a forward stop for the sheet metal bracket 16. Each longitudinal slot 25 also extends through the inboard side of its respective mounting portion 24 to accommodate the sheet metal bracket 16.

The sheet metal bracket 16 itself comprises a body portion 30 that has a retaining means at each lateral end in the form of a runner 32 that is shaped to provide two lock tangs. More specifically, the front end of each runner 32 is reversely bent to form a front lock tang 34 that slopes rearwardly and downwardly while the rear end is depressed and bent to form a rear lock tang 36 that slopes rearwardly and upwardly. These lock tangs are resilient and depress slightly when the runners 32 are pushed into the long narrow blind ended slots 25 allowing an easy assembly of the sheet metal bracket 16 to the electrical header connector 12. However, once assembled, the tangs 34 and 36 dig into opposite surfaces in the slots 25 of the plastic connector housing 18 to strongly resist any attempt to pull the runners 32 out of the long narrow blind ended slots 25. Thus sheet metal bracket 16 is securely fastened to the electrical header connector 12 by two sets of lock tangs 34 and 36.

Figure 3:
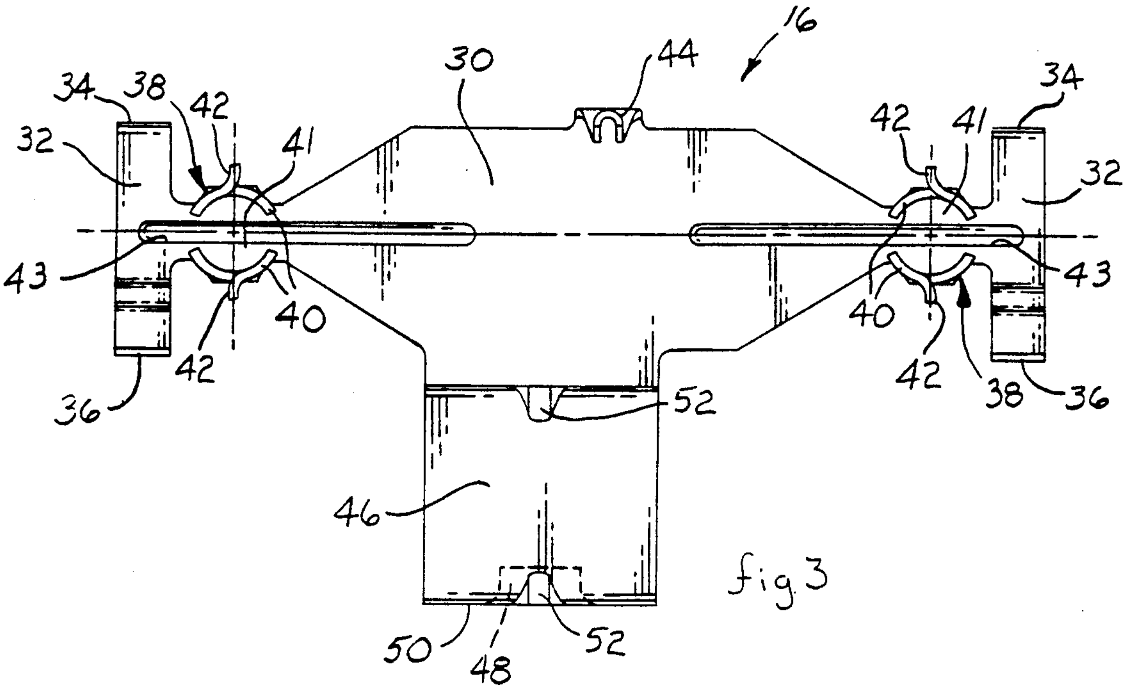
FIG. 3 is a top or plan view of the sheet metal bracket.
Figure 4:
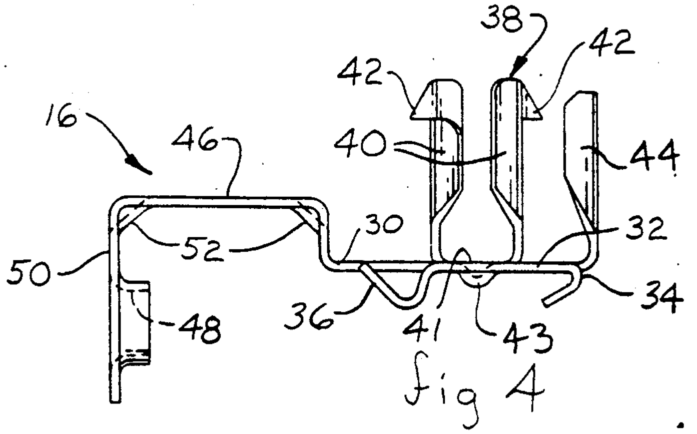
FIG. 4 is a side view of the sheet metal bracket.
Figure 5:
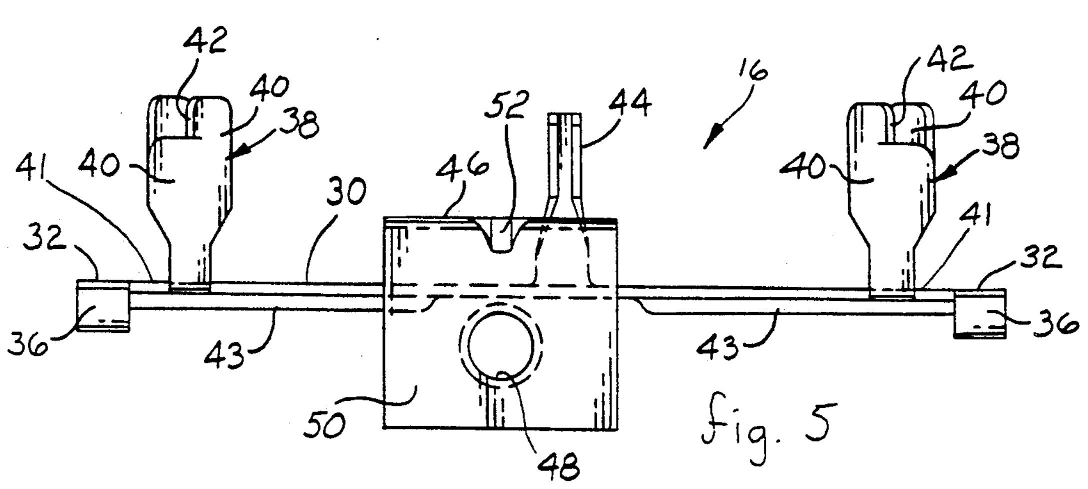
FIG. 5 is a rear view of the sheet metal bracket.
Figure 6:
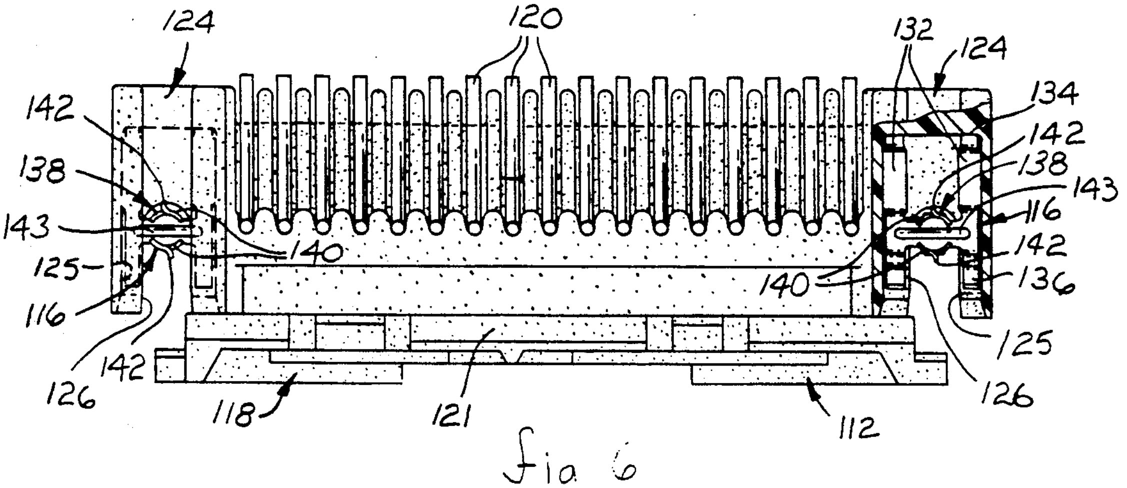
FIG. 6 is a top view of a second electrical header connector that has two sheet metal brackets in accordance with a second embodiment of this invention.

The sheet metal bracket 16 further comprises a pair of spring clips 38 disposed between the runners 32. Each spring clip 38 is formed by two cantilevered fingers 40 that are bent perpendicularly to a base 41 forming part of the body portion 30. The fingers 40 of each spring clip 38 have curved upper portions that are shaped to fit in a round hole as best shown in FIG. 3. The upper end of each finger 40 is slit parallel to the base 41 to separate an upper end portion that is bent radially outwardly to form a retention barb 42. It should be noted that the retention barbs 42 are robust and are easily formed by slitting and bending operations which do not require complex tooling.

The body portion 30 has strengthening ribs 43 at each lateral end that run through the respective bases 41 of the spring clips 38 and part way into the runners 32.

Besides securing the electrical header connector 12 to the printed circuit board 14, the sheet metal bracket 16 also provides an electrical connection between a ground wire (not shown) and a plated ground contact hole 23 of the printed circuit board 14. For this purpose, the sheet metal bracket 16 includes an upright ground contact that is in the form of a roll pin 44 that is integrally attached to a forward edge of the body portion 30. The sheet metal bracket 16 further includes a U-shaped tab 46 that is integrally attached to a rearward edge of the body portion 30. The tab 46 has a drawn screw hole 48 in remote end plate 50. The drawn screw hole 48 provides an increased surface for a self tapping screw (not shown) that is used to attach a ring or spade terminal (not shown) of the ground wire to the end plate 50. The U-shaped tab 46 also includes strengthening ribs 52.

The sheet metal bracket 16 is attached to the electrical header connector 12 by pushing the runners 32 into the narrow longitudinal slots 25 of the mounting portions 24 until the runners 32 bottom out in these blind ended slots whereupon the sheet metal bracket 16 is securely fastened by two sets of lock tangs 34 and 36 as described above. This places the spring clips 38 in the vertical slots 26 and also correctly positions the spring clips 38 and ground contact 44 with respect to the plastic connector housing 18. Thus the array of spring clips 38, ground contact 44 and vertical ends of pin terminals 20 of the electrical header connector/sheet metal bracket subassembly match the array of mounting holes 54, ground contact hole 23 and contact holes 22 in the printed circuit board 14.

The electrical header connector/sheet metal bracket subassembly is then fastened to the printed circuit board 14 by a simple plugging operation whereby the spring clips 38 are pushed into the mounting holes 54 so that the barbs 42 snap through the mounting holes 54 and engage behind top portions of the printed circuit board 14 as shown in FIG. 2. The electrical connections of the pin terminals 20 and ground contact 44 and the mechanical connections of the spring clips 38 may then be wave soldered in a conventional manner. This enhances the mechanical as well as the electrical connections between the electrical header connector 12 and the printed circuit board 14.

Referring now to FIGS. 6 through 11, a second printed circuit board assembly 110 is illustrated in which a second electrical header connector 112 is secured to a printed circuit board 114 by two identical sheet metal brackets 116 in accordance with a second embodiment of this invention.

Figure 7:
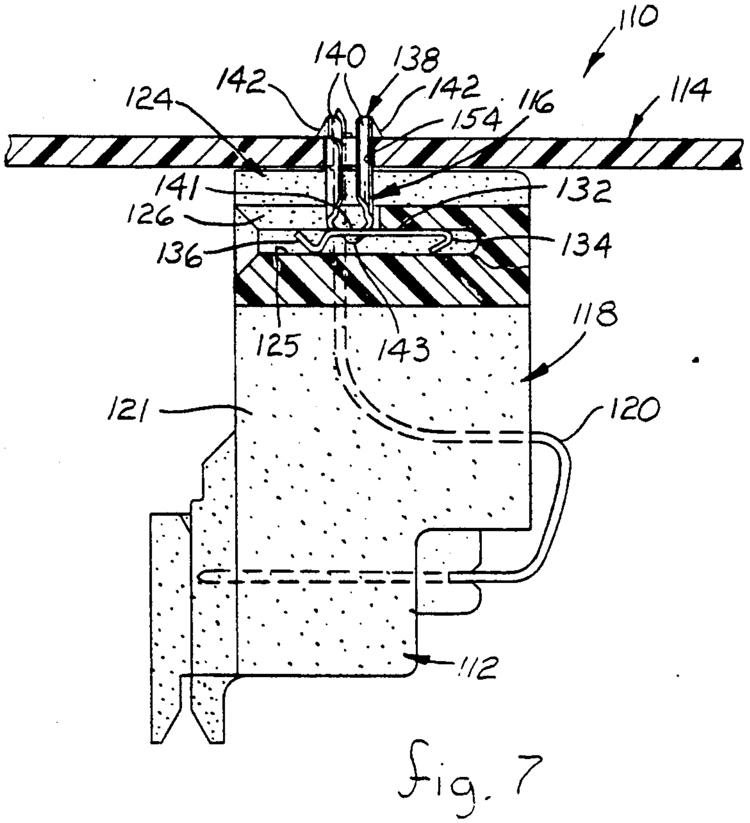
FIG. 7 is a side view of a second printed circuit board assembly using the electrical header connector and sheet metal brackets of FIG. 6 with the electrical header connector partially sectioned to illustrate details of a typical one of the two sheet metal brackets.

The electrical header connector 112 comprises a plastic connector housing 118 that contains a plurality of serpentine shaped pin terminals 120. The horizontal ends of the pin terminals 120 project into a socket portion 121 of the plastic connector housing 118 that receives an electrical plug connector of a wiring harness (not shown). The vertical ends of the pin terminals 120 project above the top of the plastic connector housing 118 and extend through plated contact holes of the printed circuit board 114 when the header connector 112 is secured to the printed circuit board 114 as shown in FIG. 7. The vertical ends of the pin terminals are wave soldered to the printed circuit board 114 to establish a good electrical contact with the plated contact holes in accordance with conventional manufacturing techniques.

The top of the plastic connector housing 118 has two identical laterally spaced mounting portions 124 that are adapted to receive one of the identical sheet metal brackets 116. Consequently, each mounting portion 124 has a narrow longitudinal slot 125 that is intersected by a vertical slot 126 that extends through the top of the plastic connector housing 118. The longitudinal slot 125 of each mounting portion 124 is blind ended to serve as a forward stop for the sheet metal brackets 116.

Each sheet metal bracket 116 comprises a body portion 130 that has a retaining means at each lateral end in the form of a runner 132 that is shaped to provide two lock tangs. More specifically, the front end of each runner 132 is reversely bent to form a front lock tang 134 that slopes rearwardly and downwardly while the rear end is depressed and bent to form a rear lock tang 136 that slopes rearwardly and upwardly. These lock tangs are resilient and depress slightly when the runners 132 are pushed into the long narrow blind ended slots 125 allowing an easy assembly of the sheet metal brackets 116 to the electrical header connector 112. However, once assembled, the tangs 134 and 136 dig into opposite surfaces in the slots 125 of the plastic connector housing 118 and strongly resist any attempt to pull the runners 132 out of the long narrow blind ended slots 125. Thus each of the sheet metal brackets 116 are securely fastened to the electrical header connector 112 by two sets of lock tangs 134 and 136.

Figure 8:
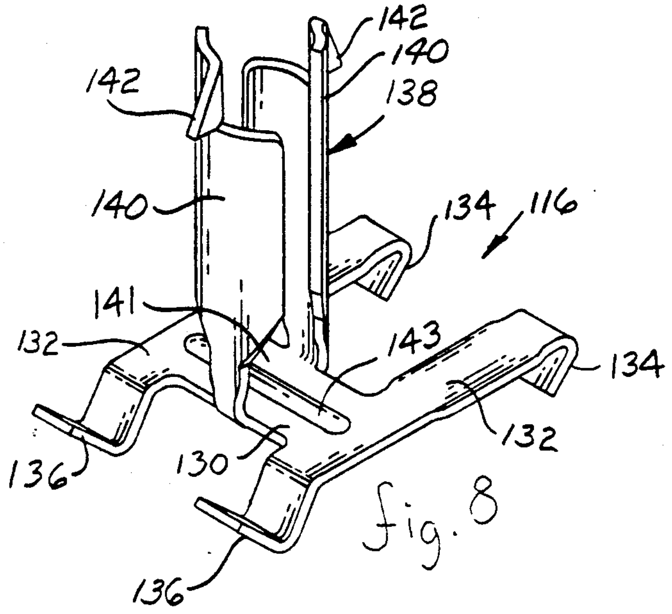
FIG. 8 is a perspective view of a typical sheet metal bracket of FIGS. 6 and 7.
Figure 9:
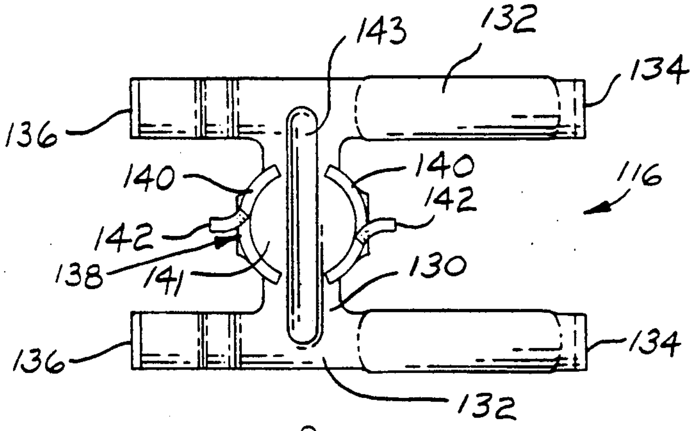
FIG. 9 is a top or plan view of the sheet metal bracket of FIG. 8.
Figure 10:
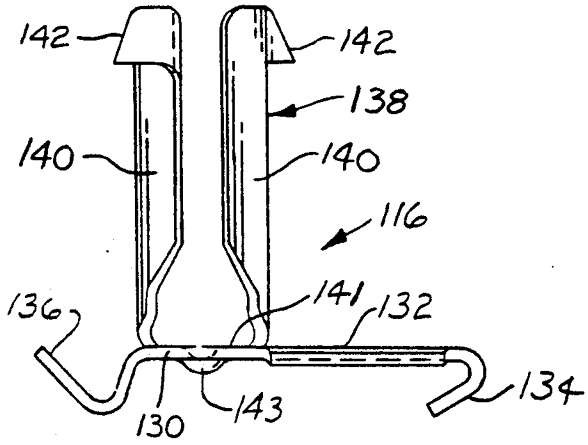
FIG. 10 is a side view of the sheet metal bracket of FIG. 8.
Figure 11:
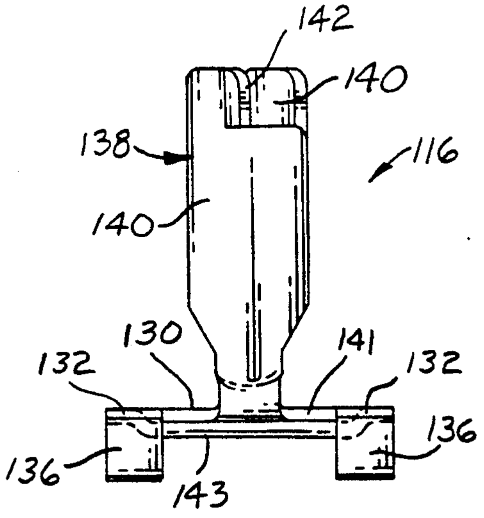
FIG. 11 is a rear view of the sheet metal bracket of FIG. 8.

Each sheet metal bracket 116 further comprises a spring clip 138 disposed between the runners 132. The spring clip 138 is formed by two cantilevered fingers 140 that are bent perpendicularly to a base 141 forming part of the body portion 130. The fingers 140 of the spring clip 138 have curved upper portions that are shaped to fit in a round hole as best shown in FIGS. 7 and 8. The upper end of each finger 140 is slit parallel to the base 141 to separate an upper end portion that is bent radially outwardly to form a retention barb 142. It should be noted that the retention barbs 142 are robust and are easily formed by slitting and bending operations which do not require complex tooling.

The body portion 130 has a strengthening rib 143 that runs through the base 141 of the spring clip 138 and part way into the runners 132 at each end.

The sheet metal brackets 116 are attached to the electrical header connector 112 by pushing the runners 132 of the respective sheet metal brackets 116 into the narrow longitudinal slots 125 of the respective mounting portions 124 until the runners 132 bottom out in these blind ended slots whereupon each of the sheet metal brackets 116 is securely fastened by two sets of lock tangs 134 and 136 as described above. This also correctly positions the spring clips 138 with respect to the plastic connector housing 118 so that the array of spring clips 138 and vertical ends of pin terminals 120 of the electrical header connector/sheet metal bracket subassembly match the array of mounting holes 154 and contact holes in the printed circuit board 114.

The electrical header connector/sheet metal bracket subassembly is then fastened to the printed circuit board 114 by a simple plugging operation whereby the spring clips 138 are pushed into the mounting holes 154 so that the barbs 142 snap through the mounting holes 154 and engage behind top portions of the printed circuit board 114 as shown in FIG. 7. The electrical connections of the pin terminals 120 and the mechanical connections of the spring clips 138 may then be wave soldered in a conventional manner. This enhances the mechanical as well as the electrical connections between the electrical header connector 112 and the printed circuit board 114.

We wish it to be understood that we do not desire to be limited to the exact details of construction shown and described, for obvious modifications will occur to a person skilled in the art.

The embodiments of the invention in which an exclusive property or privilege is claimed are defined as follows:

1. A sheet metal bracket for attaching an electrical header connector to a printed circuit board comprising:

a body portion that has a retaining means at each lateral end in the form of a runner that is shaped to provide two lock tangs, each runner having a front end that is reversely bent to form a front lock tang that slopes rearwardly and downwardly and a rear end that is depressed and bent to form a rear lock tang that slopes rearwardly and upwardly, the lock tangs being resilient whereby the lock tangs depress slightly when the runners are pushed into narrow longitudinal slots of an electrical header connector or the like to allow easy assembly of the sheet metal bracket to the electrical header connector and after assembly dig into opposite surfaces in the slots to strongly resist any attempt to pull the runners out of slots whereby the sheet metal bracket is adapted to be securely fastened to the electrical header connector, and the body portion further including at least one spring clip disposed between the runners for attaching the electrical header connector to a printed circuit board, the spring clip being formed by two cantilevered fingers that are bent perpendicularly to a base forming part of the body portion, the fingers having curved upper portions that are shaped to fit in a round hole, the upper end of each finger being slit parallel to the base to separate an upper end portion that is bent radially outwardly to form a retention barb.

2. The sheet metal bracket as defined in claim 1 wherein the body portion has strengthening ribs at each lateral end that run through the respective bases of the spring clips and part way into the runners.

3. The sheet metal bracket as defined in claim 1 further including an upright ground contact that is in the form of a roll pin that is integrally attached to a forward edge of the body portion and a U-shaped tab that is integrally attached to a rearward edge of the body portion, the tab having a drawn screw hole in a remote end plate for receiving a self tapping screw to attach a ground wire terminal to the end plate.

4. The sheet metal bracket as defined in claim 1 wherein the body portion has a pair of spring clip disposed between the runners for attaching the electrical header connector to the printed circuit board.

5. A sheet metal bracket for attaching an electrical header connector to a printed circuit board comprising:

a body portion that has a retaining means at each lateral end in the form of a runner that is shaped to provide two lock tangs, each runner having a front end that is reversely bent to form a front lock tang that slopes rearwardly and downwardly and a rear end that is depressed and bent to form a rear lock tang that slopes rearwardly and upwardly, the lock tangs being resilient whereby the lock tangs depress slightly when the runners are pushed into narrow longitudinal slots of an electrical header connector or the like to allow easy assembly of the sheet metal bracket to the electrical header connector and after assembly dig into opposite surfaces in the slots to strongly resist any attempt to pull the runners out of slots whereby the sheet metal bracket is adapted to be securely fastened to the electrical header connector, and the body portion further including at least one spring clip disposed between the runners for attaching the electrical header connector to a printed circuit board.

6. The sheet metal bracket as defined in claim 5 wherein the spring clip is formed by two cantilevered fingers that are bent perpendicularly to a base forming part of the body portion, the fingers have curved upper portions that are shaped to fit in a round hole, and the upper portions are slit to separate portions that are bent outwardly to form retention barbs.

7. The sheet metal bracket as defined in claim 5 wherein the body portion has a pair of spring clips disposed between the runners for attaching the electrical header connector to the printed circuit board.

8. The sheet metal bracket as defined in claim 7 wherein the spring clips are formed by two cantilevered fingers that are bent perpendicularly to a base forming part of the body portion, the fingers have curved upper portions that are shaped to fit in a round hole, and the upper portions are slit to separate portions that are bent outwardly to form retention barbs.

9. A sheet metal bracket for attaching an electrical header connector to a printed circuit boar comprising:

a body portion that has retaining means at each lateral end that are adapted for insertion into narrow longitudinal slots of an electrical header connector or the like to securely fasten the sheet metal bracket to the electrical header connector, and the body portion further including at least one spring clip disposed between the runners for attaching the electrical header connector to a printed circuit board, the spring clip being formed by two cantilevered fingers that are bent perpendicularly to a base forming part of the body portion, the fingers having curved upper portions that are shaped to fit in a round hole, the upper end of each finger being slit parallel to the base to separate an upper end portion that is bent radially outwardly to form a retention barb.

10. The sheet metal bracket as defined in claim 9 wherein the body portion has retaining means at each lateral end that are in the form of a runner that is shaped to provide two lock tangs that dig into opposite surfaces in the slots and strongly resist any attempt to pull the runners out of slots to securely fasten the sheet metal bracket to the electrical header connector.

11. The sheet metal bracket as defined in claim 10 wherein each runner has a front end that is reversely bent to form a front lock tang that slopes rearwardly and downwardly and a rear end that is depressed and bent to form a rear lock tang that slopes rearwardly and upwardly.

12. The sheet metal bracket as defined in claim 11 wherein the body portion has a pair of spring clips disposed between the runners for attaching the electrical header connector to the printed circuit board.

13. A sheet metal bracket for attaching an electrical header connector to a printed circuit board comprising:

a body portion that has retaining means at each lateral end that are adapted for insertion into narrow longitudinal slots of an electrical header connector or the like to securely fasten the sheet metal bracket to the electrical header connector, and the body portion further including at least one spring clip disposed between the retaining means for attaching the electrical header connector to a printed circuit board.

* * * * *